(12) United States Patent
Kernahan

(10) Patent No.: US 7,969,757 B2
(45) Date of Patent: Jun. 28, 2011

(54) APPARATUS PROVIDING BIAS TO SOLAR CELLS

(75) Inventor: Kent Kernahan, Cupertino, CA (US)

(73) Assignee: Array Converter, Inc., Sunnyvale, CA (US)

( * ) Notice: Subject to any disclaimer, the term of this patent is extended or adjusted under 35 U.S.C. 154(b) by 279 days.

(21) Appl. No.: 12/334,234

(22) Filed: Dec. 12, 2008

(65) Prior Publication Data

US 2010/0149847 A1 Jun. 17, 2010

(51) Int. Cl.
 *H02M 7/48* (2007.01)
 *H01L 31/00* (2006.01)

(52) U.S. Cl. ........... 363/98; 136/293; 250/215; 323/906

(58) Field of Classification Search ............ 363/89, 363/95, 96, 97, 98; 323/906, 266; 136/290, 136/291, 293; 250/215
See application file for complete search history.

(56) References Cited

U.S. PATENT DOCUMENTS

| 4,816,982 | A * | 3/1989 | Severinsky | 363/44 |
| 6,339,538 | B1 * | 1/2002 | Handleman | 363/95 |
| 6,365,825 | B1 * | 4/2002 | Hayashi et al. | 136/243 |
| 2005/0284517 | A1 | 12/2005 | Shinohara | |
| 2006/0262576 | A1 | 11/2006 | Przybyla | |
| 2008/0088829 | A1 | 4/2008 | Fuyuki | |
| 2008/0094019 | A1 | 4/2008 | Steigerwald et al. | |

OTHER PUBLICATIONS

"Fabrication of Stable, Large-Area Thin-Film CdTe Photovoltaic Modules, Final Subcontract Report", T.X. Zhou, National Renewable Energy Laboratory, 1617 Cole Blvd., Golden, CO. 80401. Jun. 1995.
"An Investigation Into Degradation of CdTe Solar Cells", Donald Thomas Morgan, Colorado School of Mines, Golden Colorado, 1998.
"Effect of CdCl2 Treatment on CdTe and CdS Solar Cell Characteristics after Exposure to Light for 1000 Hours", Ashok Rangaswamy, University of South Florida, Jul. 11, 2003.

* cited by examiner

*Primary Examiner* — Gary L Laxton
(74) *Attorney, Agent, or Firm* — The Marbury Law Group PLLC

(57) ABSTRACT

Solar panels of certain technologies may experience a degradation of their efficiency as a result of exposure to sunlight, either prior to installation or during normal operation. A direct current to pulse amplitude modulated ("PAM") current converter, denominated a "PAMCC", is connected to the solar panel and to a source of alternating current. The PAMCC receives direct current from the solar panel and provides pulse amplitude modulated current at its output terminals at such times that the solar panel is capable to provide current, denominated "normal operation". The PAMCC may be reconfigured to form a buck converter and a rectifier wherein the rectifier converts power received at the output (during normal operation) terminals to provide rectified, direct current to the buck converter. The buck converter provides direct current in the forward biased direction to the solar panel, thereby reconditioning the solar panel. Alternating current received at the output terminals of the PAMCC may be provided by an electric grid or by other means, such as other solar power converters.

20 Claims, 19 Drawing Sheets

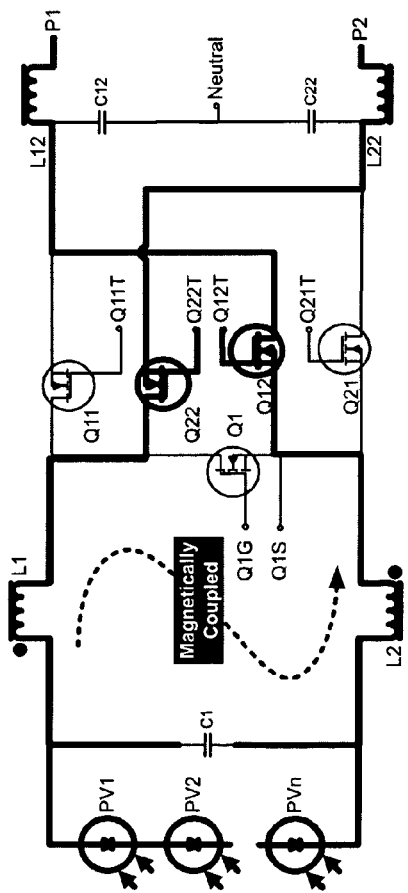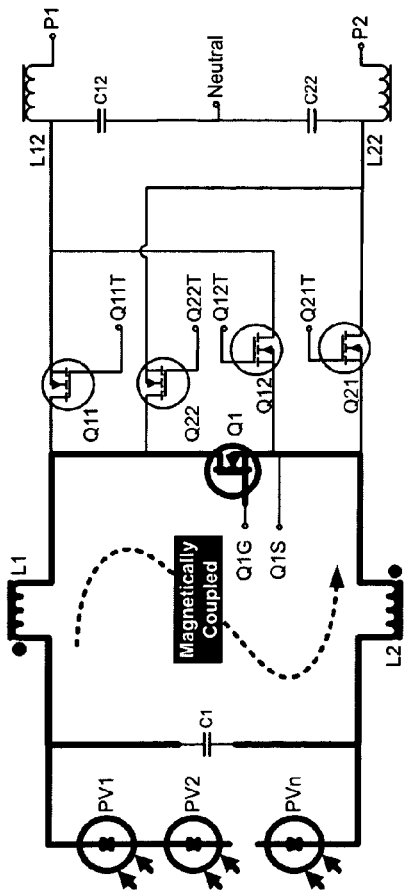
FIG. 19
FIG. 20

APPARATUS PROVIDING BIAS TO SOLAR CELLS

CROSS REFERENCE TO RELATED APPLICATIONS

This application is related to commonly-owned U.S. patent application Ser. No. 12/061,025 submitted Apr. 2, 2008 by Kernahan et al, which application is incorporated herein in its entirety.

BACKGROUND

Efficiency of conversion of solar energy into direct electrical current, and the cost of installed solar panels, are of great importance to the overall successful commercial adoption of solar electrical power generation. A variety of materials are used in manufacturing solar cells, a plurality of solar cells then being connected to form a solar panel. Examples include crystalline cells based upon doped silicon and thin film cells based upon cadmium-telluride ("Cd—Te"). Cd—Te is of interest to the industry for its low total cost of manufacture. However Cd—Te cells are known to lose efficiency as a result of exposure to sunlight. During construction, solar panels may be staged at a construction site such that they are exposed to sunlight, a condition so-called "light soaking." During normal operation, solar panels are obviously exposed to sunlight, thus light soaked. In either case, efficiency is unavoidably lost over exposure time, such loss being cumulative.

Cd—Te cells may be reconditioned, thereby restoring their efficiency, by providing direct current to the series-connected cells under controlled conditions. The polarity and profile of the value of direct current which best results in reconditioning of the Cd—Te cells varies by the chemistry and structure of the cells and substrate by a given manufacturer, by time (that is, light soaking experienced and life time), and manufacturing variations between cells and panels. However the solutions for providing reconditioning of the present art are difficult to implement and expensive. What is needed is an economical means for controlling the power conversion of the solar panels during normal operation as well as providing the desired bias current from time to time to recondition Cd—Te solar cells as-needed.

SUMMARY

According to the present invention, a DC to pulse amplitude modulated ("PAM") current converter, denominated a "PAMCC" is connected to an individual solar panel ("PV"). The PAMCC is electrically connected in parallel across the output terminals of the solar panel. A solar panel typically is comprised of a plurality, commonly seventy-two, individual solar cells connected in series, wherein each cell provides approximately 0.5 volt at some current, the current being a function of the intensity of light flux impinging upon the panel. The PAMCC receives direct current ("DC") from a PV and provides pulse amplitude modulated current at its output. The pulse amplitude modulated current pulses are typically discontinuous or close to discontinuous with each pulse going from near zero current to the modulated current and returning to near zero between each pulse. The pulses are produced at a high frequency relative to the signal modulated on a sequence of pulses. The signal modulated onto a sequence of pulses may represent portions of a lower frequency sine wave or other lower frequency waveform, including DC. When the PAMCC's output is connected in parallel with the outputs of similar PAMCCs an array of PAMCCs is formed, wherein the output pulses of the PAMCCs are out of phase with respect to each other. An array of PAMCCs constructed in accordance with the present invention form a distributed multiphase inverter whose combined output is the demodulated sum of the current pulse amplitude modulated by each PAMCC. If the signal modulated onto the series of discontinuous or near discontinuous pulses produced by each PAMCC was an AC current sine wave, then a demodulated, continuous AC current waveform is produced by the array of PAMCCs. This AC current waveform is suitable for use by both the "load", meaning the premises that is powered or partially power by the system, and suitable for connection to a grid. For example, in some embodiments an array of a plurality of PV-plus-PAMCC modules are connected together to nominally provide split-phase, Edison system 60 cps 240 volt AC to a home.

During normal operation, the array converters operate cooperatively to provide alternating current power at the output terminals of the array, such as shown in FIG. 2 (204). Typically the array output terminals are connected to an electrical grid, wherein the array converters provide power to the grid when sufficient sunlight is incident upon the solar panels comprising the array. Note that there is a one for one correspondence; that is, each solar panel is connected to an individual array converter. As will be seen in more detail hereinafter, according to the present invention, an individual array converter may be reconfigured to change from providing power from the PV to a load, such as an electrical grid, to instead provide recondition power to the PV from a power source normally connected to the array converter output terminals. In this mode, according to the present invention, the array converter is reconfigured to form a buck converter and a rectifier, wherein the array converter rectifies the alternating current provided to the output terminals of the array converter, providing the rectified current to the buck converter, the buck converter providing direct current of a selected polarity and voltage to the series-connected solar cells which comprise the solar panel. That is, during normal operation the solar panel provides current to the array converter, the current flowing through the solar cells comprising the solar panel in a reverse-biased direction, and the same array converter may be reconfigured to drive current through the solar cells comprising the solar panel, thereby reconditioning the solar cells.

In the array converter architecture, the current path for both phases passes through the same coils in both directions. This results in identical current flowing in both phases.

Due to the balanced topology of array converters, the positive end to the diode array will tend to positioned above neutral by about the same voltage that the negative end is below neutral. This places the DC arc voltage far below the minimum strike potential. Limiting the internal array voltage in this manor together with almost total lack of AC components in the PV diode array (due to continuous conduction mode input current) largely eliminates the need for stringent leakage path to ground specifications found in high voltage DC string applications. This simplifies manufacturing process between the edge of the PV diode array and frame of the module, and the backside of the internal array and the back of the module. For example: if the leakage requirement of a 450V max string series connected panel between grounded frame and internal PV diode array is 2ua, the insulation requirement is 225M Ohms. In an array converter with a 30V maximum between PV diode array and neutral, the same leakage may only require 15M Ohms insulation. The low nominal operating voltages of the PV diode array relative to ground also allow for the use of lower voltage spark gap and MOV components improving the path to ground for lightning and corona discharge (antennas) and other high voltage effects.

Whether cased by detected grid anomalies such as voltage out of bounds or locally or remotely originated shut down commands, the panels of the present invention are shut down to a safe state. In one state, the internal PV array is open circuit, internal inductors are discharged and internal power semiconductors are open circuit. In this state, a fireman's ax would experience no more than the open circuit voltage of the internal PV array, typically 40V. Since the safe state of the internal PV array is open, two short circuits would have to be formed (one to ground) for the ax to experience current or voltage. In another embodiment the PV is not configured as open circuit, but rather is controlled to provide a low voltage output.

BRIEF DESCRIPTION OF THE DRAWINGS

FIG. 19 is the circuit of FIG. 16, configured as a buck power converter during a half-cycle of an input alternating current power source, wherein the polarity of the power source is the opposite of that for FIG. 17.

FIG. 20 is the circuit of FIG. 16, configured as a buck power converter during a synchronous phase following the configuration of FIG. 19.

DETAILED DESCRIPTION OF SOME EMBODIMENTS

Definition of Some Terms

Figure 1:
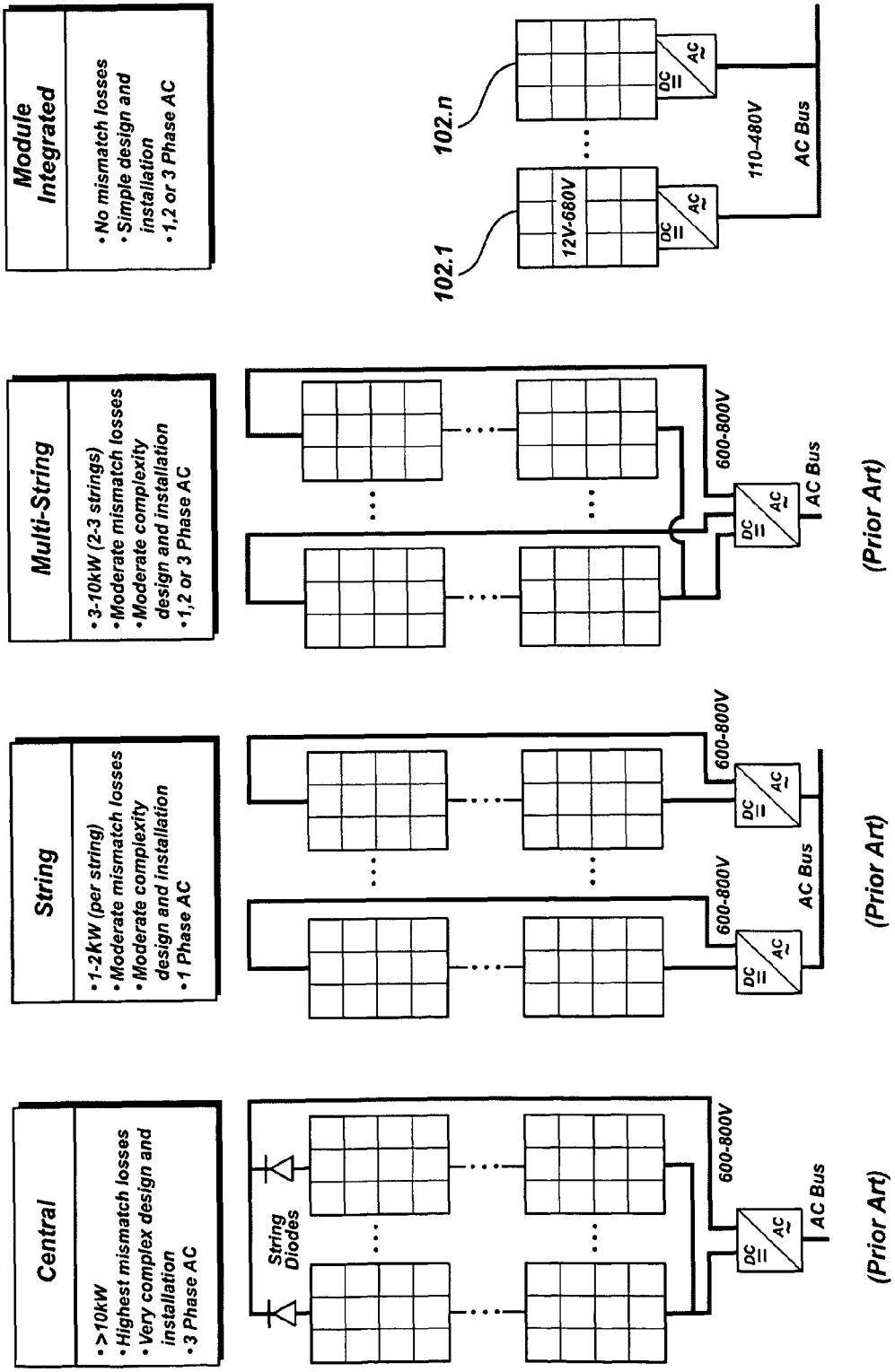
FIG. 1 shows examples of the prior art and a brief example of the present invention.
Figure 2:
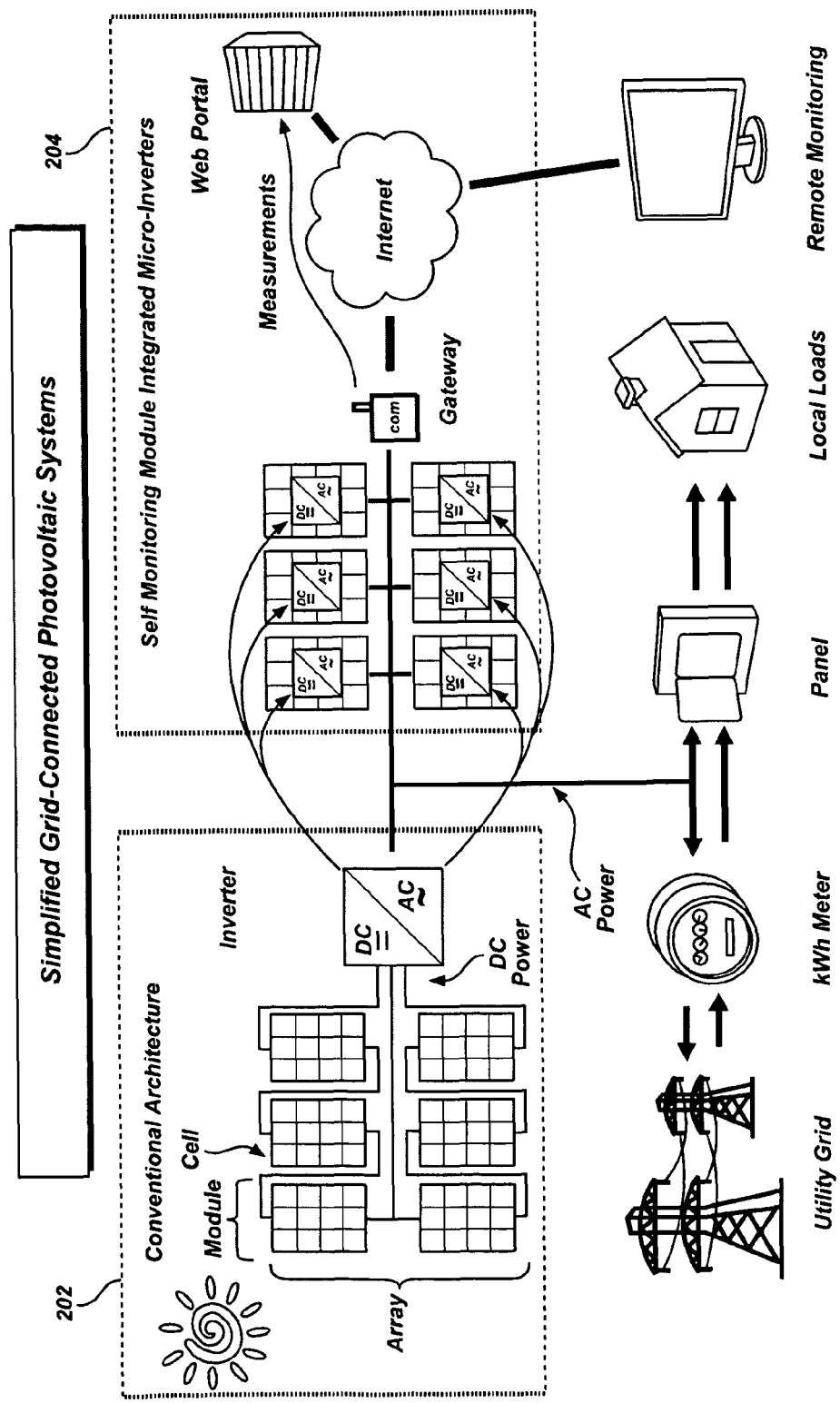
FIG. 2 is an example of grid-connected photovoltaic systems.

| | |
|---|---|
| Islanding | Operation of an on-premises power generating system that is normally connected to a grid which continues to operate when it is not connected to the grid. |
| Grid | AC power provided to a premises by an outside source, typically a utility company. |
| PV | Photovoltaic panel; another term for the commonly-used "solar panel" |
| cps | Abbreviation for "cycles per second"; the frequency of an AC power supply |
| AC | Abbreviation for "alternating current", though one may also view it as "alternating voltage" in that the polarity of the voltage provided alternates. |
| DC | Abbreviation for "direct current"; electrical power that is always provided in a given polarity. The voltage of the power source may or may not be fixed. |
| FET | Field effect transistor |
| PAM | Pulse Amplitude Modulation. a form of signal modulation where the message information is encoded in the amplitude of a series of signal pulses. |
| PCM | Pulse Code Modulation. a digital representation of an analog signal where the magnitude of the signal is sampled regularly at uniform intervals, then quantized to a series of symbols in a digital (usually binary) code. |

According to the present invention, a DC to pulse amplitude modulated ("PAM") current converter, denominated a "PAMCC" is connected to an individual solar panel ("PV"). A solar panel typically is comprised of a plurality, commonly seventy-two, individual solar cells connected in series, wherein each cell provides approximately 0.5 volt at some current, the current being a function of the intensity of light flux impinging upon the panel. The PAMCC receives direct current ("DC") from a PV and provides pulse amplitude modulated current at its output. The pulse amplitude modulated current pulses are typically discontinuous or close to discontinuous with each pulse going from near zero current to the modulated current and returning to near zero between each pulse. The pulses are produced at a high frequency relative to the signal modulated on a sequence of pulses. The signal modulated onto a sequence of pulses may represent portions of a lower frequency sine wave or other lower frequency waveform, including DC. When the PAMCC's output is connected in parallel with the outputs of similar PAMCCs an array of PAMCCs is formed, wherein the output pulses of the PAMCCs are out of phase with respect to each other. An array of PAMCCs constructed in accordance with the present invention form a distributed multiphase inverter whose combined output is the demodulated sum of the current pulse amplitude modulated by each PAMCC. If the signal modulated onto the series of discontinuous or near discontinuous pulses produced by each PAMCC was an AC current sine wave, then a demodulated, continuous AC current waveform is produced by the array of PAMCCs. This AC current waveform is suitable for use by both the "load", meaning the premises that is powered or partially power by the system, and suitable for connection to a grid. For example, in some embodiments an array of a plurality of PV-plus-PAMCC modules are connected together to nominally provide split-phase, Edison system 60 cps 240 volt AC to a home.

Before discussing an array comprising a plurality of PV-plus-PAMCC modules, we first look at an individual PAMCC. For example, referring to FIG. 4, a PV panel is electronically represented by the diodes and capacitor shown as reference numeral 401. As disclosed previously the solar panel 401 may be replace by and DC source. Collectively the components comprising an PAMCC (or sometimes "micro inverter") are referred to as simply "the PAMCC 400." Current is provided by the PV 401 to a positive input terminal 402 and a negative input terminal 403. The positive input terminal 402 is connected in series with a coil L1 406. The negative input terminal 403 is connected in series with a coil L2 405. In one embodiment coils L1 406 and L2 405 form a one-to-one transformer with two input and two output terminals. Such an embodiment provides better current matching through the two current paths. Hereinafter we refer to the single transformer as "T1" 407. A switch Q1 404, for example an NMOS FET, is connected across the load side of the transformer T1 407, with the source of Q1 404 connected in parallel to the negative terminal of the T1 407 output. Note that the negative sides of the PV 401 and of the PAMCC 400 are floating; that is, they are not electrically grounded. A controller 412 has an output terminal 414 which provides a signal to the control gate (Q1G) of Q1 404 on a line 411. In some embodiments the controller 412 is a microprocessor with additional logic and is operated by a program. The controller 412 is discussed in more detail hereinafter.

The controller 412 comprises a plurality of output terminals, each operated independently. Four controller 412 output terminals 415 through 418 are connected to the control terminals of four SCRs (CR11 424; CR22 423; CR12 425; and CR21 426 respectively) by four lines 119 through 422 respectively (inner-connections not shown). Each line, therefore each SCR, is independently controlled by control signals from the controller 412. The anode terminals of CR11 424 and CR22 423 are connected in parallel to the positive output terminal of T1 407. The cathode terminals of SCRs CR12 425 and CR21 426 are connected in parallel to the negative output terminal of T1 407. The cathode terminal of SCR CR11 424 and the anode terminal of SCR CR12 425 are connected in parallel to a coil L12 430. The cathode terminal of SCR CR22 423 and the anode terminal of SCR CR21 426 are connected in parallel to a coil L22 431. A terminal 434 from coil L12 430 is arbitrarily designated as providing a "phase 1" (P1) output and a terminal 436 from coil L22 431 is arbitrarily designated as providing a "phase 2" (P2) output. In some embodiments the coils L12 430 and L22 431 are embodied in a one-to-one transformer. In the embodiment exemplified in FIG. 4 coils L12 430 and L22 136 are separate coils. A capacitor C12 438 is across the input side of coil L12 430 and a neutral output terminal 432. Another capacitor C22 is across the input side of coil L22 431 and the neutral output terminal 432. In another embodiment there is no neutral output terminal 432 and there is a single capacitor across the input terminals of coil L12 430 and L22 431; in this embodiment the voltage rating of the capacitor is at least twice that of capacitors C22 440 and C12 438.

The method of the invention is implemented by control signals on lines 411 and 419 through 422. In particular the control signal Q1G on line 411 and signals CR11T on line 419; CR22T on line 420; CR12T on line 421; and CR21T on line 422 connect and disconnect the current provided by PV 401 in a sequence within the PAMCC 400 with a high-frequency period, for example 30 KHz, which provides a PCM signal which is modulated by a slower, 60 cycle pattern, thereby providing an output whose amplitude is a PAM signal approximating a sine wave.

Figure 4:
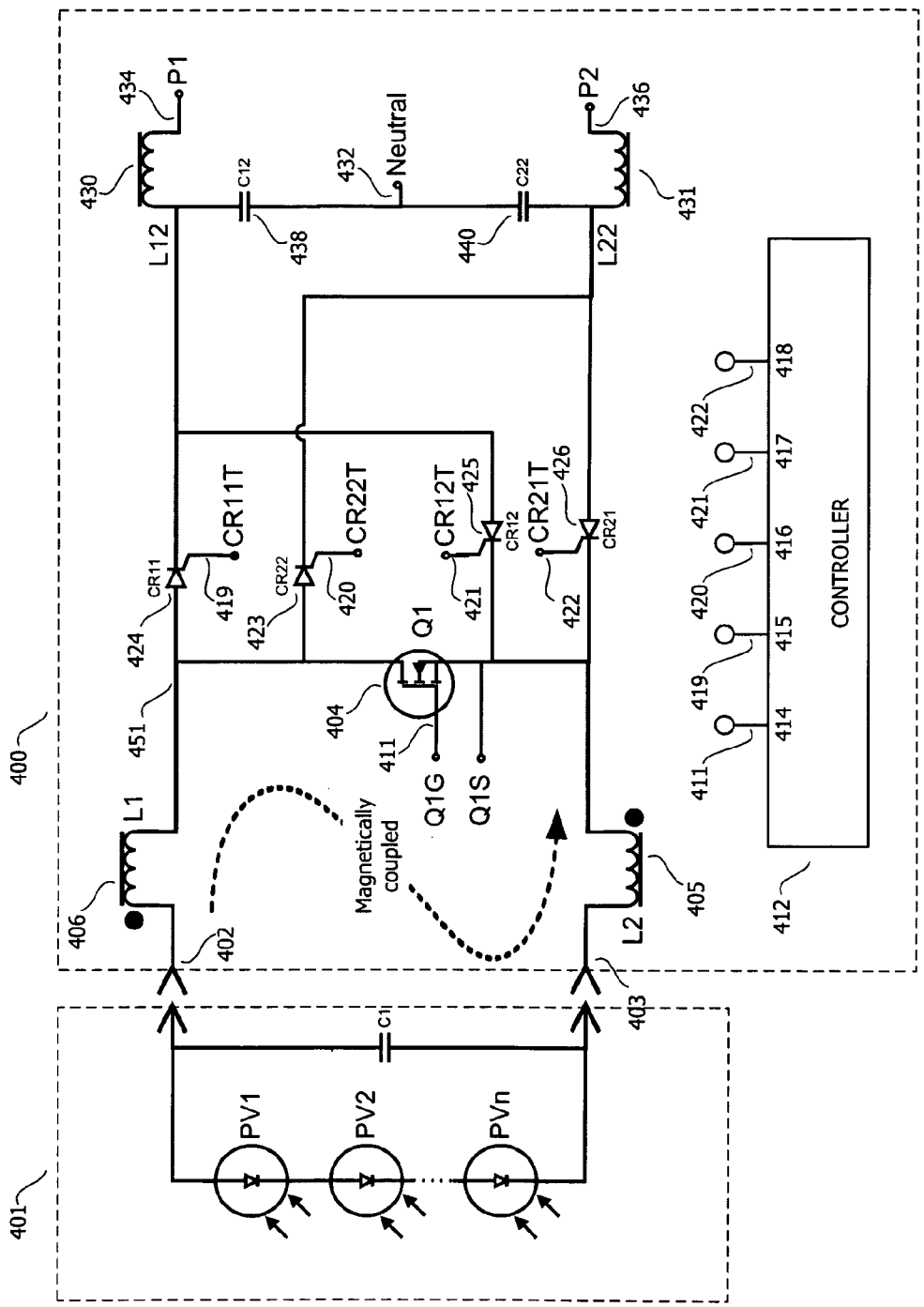
FIG. 4 is an example of a single pulse amplitude modulated current converter according to the present invention.

Referring to FIG. 4, the initial conditions are as follows: Q1 404, CR11 424, CR22 423, CR12 425 and CR21 426 de-energized; coils L1 406, L2 405, L12 430 and L22 431 empty of current; and photovoltaic cells PV1 through PVn dark. In this condition the grid AC voltage is applied between P1 434 and P2 436 and experiences a path through L12 430, C12 438, C22 440 and L22 431. The resonate frequency selected for a reconstruction filter comprising L12 430 and C12 438 is typically chosen to be about one half the switching frequency of Q1 404. The resonate frequency of a reconstruction filter comprising L22 431 and C22 440 is chosen to be the same as the reconstruction filter of L12 430 and C12 438. In one embodiment the transistor Q1 404 is selected for a specified switching frequency of approximately 30 kHz and the resonate frequency of the reconstruction filters are then designed for 15 kHz. With the grid AC voltage typically being 60 Hz, an unimportant amount of capacitive reactive load is presented to the grid.

Circuit operation begins with the solar panel 401 being exposed to sufficient light to produce significant current. The presence of the current may be observed as an increase in voltage across Q1 404. At this point Q1 404 is initially turned on by applying a signal from controller 412 on line 411 between Q1G and Q1S. The interface between the controller 412 and the transistor Q1 404 may be optically isoloated, transformer coupled, or the controller 412 may be connected to Q1S. In this state L1 406 and L2 405 begin to charge with current. When the voltage across PV 401 falls to a predetermined value, the time to charge the coils is noted in order to calculate the current and standard operation begins with the next grid zero crossing. In one embodiment this is when the voltage at P1 crosses above P2 while P1 is going positive and P2 is going negative. At this point signals CR11T 419 and CR21T 421 are asserted such that CR11 424 and CR21 426 will conduct when current are applied to them.

Case 1: PWM Modulation for Positive Half Wave of the Grid

Figure 5:
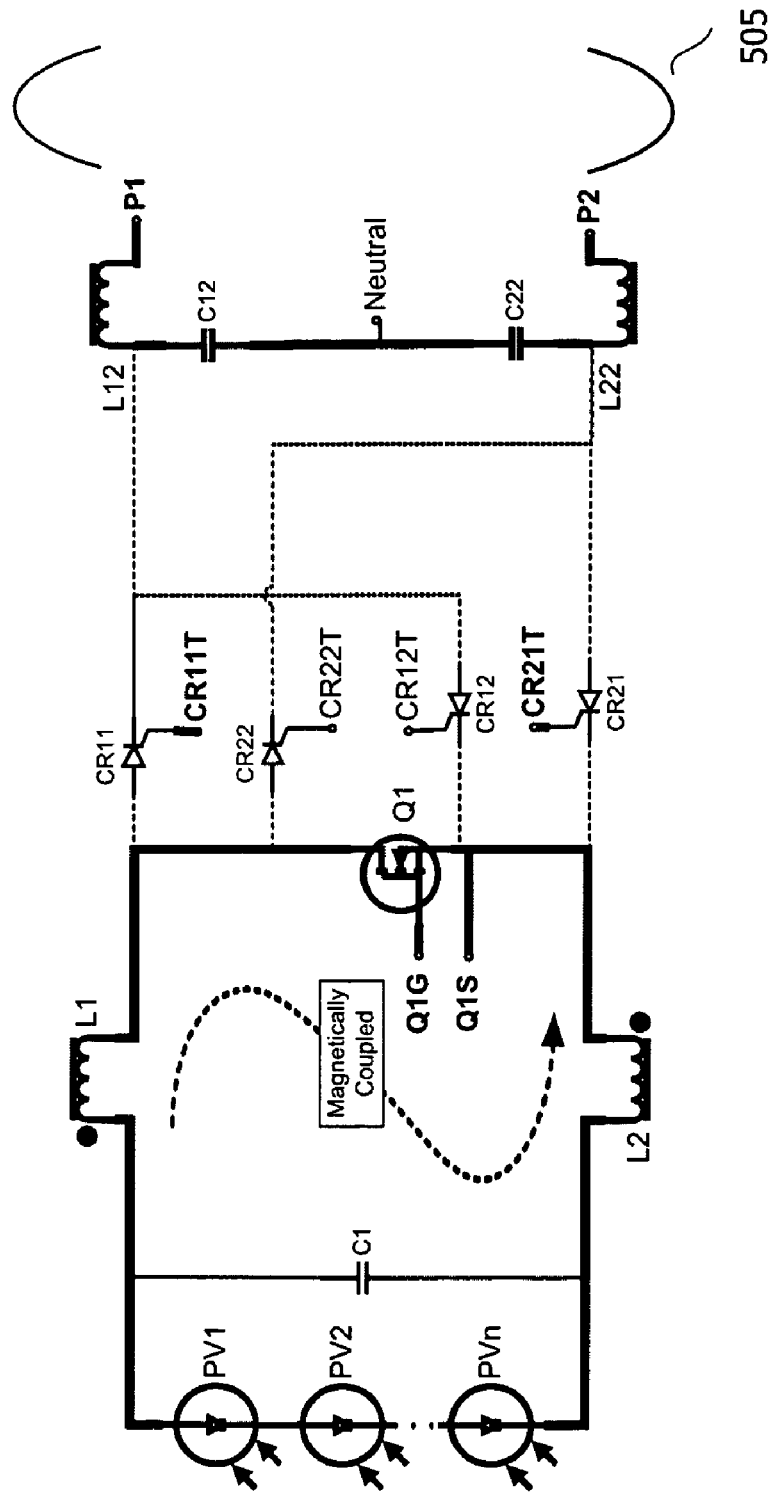
FIG. 5 shows a pulse amplitude modulated current converter with a transistor completing the circuit to charge inductors while reconstruction filters produce current pulses for the grid positive half phase.

Figures FIG. 5 through FIG. 8 will be referred to in describing the operation of PAMCC 400. Note that the components correspond to those of FIG. 4, but the reference numbers have been left off so as not to obscure the description. However we refer to the reference numbers provided by FIG. 4. Looking to FIG. 5, with L1 406 and L2 405 charged, Q1 404 is turned off for a pulse width modulated time. After the off time has expired, Q1 404 is turned on until the end of the current switching cycle. During the time that Q1 404 is off, current previously stored in L1 406 and L2 405, together with the current flowing in PV 401, is applied to the input terminals of CR11 424 and CR21 426, which remain enabled as a result of the signals CR11T 419 and CR21T 421 for the entire positive half cycle of the grid. The positive half cycle of the grid is defined as the condition wherein the voltage at output terminal P1 434 is greater than the voltage at output terminal P2 436. The charge in the current pulse delivered through the SCR CR11 424 is initially stored on capacitor C12 438, creating a voltage more positive on the near end of coil L12 430 relative to the end of coil L12 which is connected to the output terminal P1 434. The charge in the current pulse delivered through SCR CR21 426 is initially stored on capacitor C22 440, a voltage more negative on the near end of coil L22 431 relative to the end of coil L22 which is connected to the output terminal P2 436. This is the initial condition for both the reconstruction filter comprising L12 430, C12 438 and the reconstruction filter comprising L22 431, C22 440. At this point the reconstruction filters will transform the pulse width modulated current pulse delivered to them to a pulse amplitude modulated (PAM) half sine wave of current 505 delivered to the grid as shown in FIG. 5.

The resonate frequency for the reconstruction filters are chosen to be about one half the switching frequency of Q1 404 so that one half of a sine wave of current will be provided to P1 434 and P2 436 for each pulse width modulated current pulse delivered to them. Since the resonate frequency of each reconstruction filter is independent of the pulse width of current applied to it, and the charge in the instant current pulse applied to the reconstruction filter must be equal to the charge in the half sine wave of current delivered out of the reconstruction filter to the grid, changes in the pulse width of input current will be reflected as changes in the amplitude of the output of the reconstruction filters. As the current in the inductors in the reconstruction filters returns to zero, the next pulse of current is delivered to the capacitors of the reconstruction filters because the frequency of the reconstruction filters is one half the rate at which pulse width modulated current pulses are produced by Q1 404.

The off time of Q1 404 is modulated such that the width of current pulses produced is in the shape of the grid sine wave. The reconstruction filters transform this sequence of pulse width modulated current pulses into a sequence of pulse amplitude modulated current pulses whose amplitude follows corresponding points of the shape of the grid sine wave.

So long as the grid half cycle remains positive at the terminal P1 434 relative to the output of terminal P2 436, further current pulses are produced by repeating the process described hereinbefore, beginning at "CASE 1: PWM modulation for positive half wave of the grid".

The negative zero crossing of the grid voltage is defined as the condition wherein the voltage at terminal P1 434 is equal to the voltage at terminal P2 436 after P1 434 has been more positive than P2 436. Prior to the negative zero crossing, Q1 404 is turned on, thereby removing current from CR11 424 and CR21 426. At this point the signals CR11T 419 and CR21T 421 are de-asserted, preventing SCRs CR11 424 and CR21 426 from conducting current during the grid negative half cycle. After the negative zero crossing, with the voltage of terminal P1 434 more negative than the voltage of terminal P2 436, the signals CR22T 420 and CR12T 421 are then asserted, enabling CR22 423 and CR12 425 to conduct when current is applied to them.

Case 2: PWM Modulation for Negative Half Wave of Grid

Figure 6:
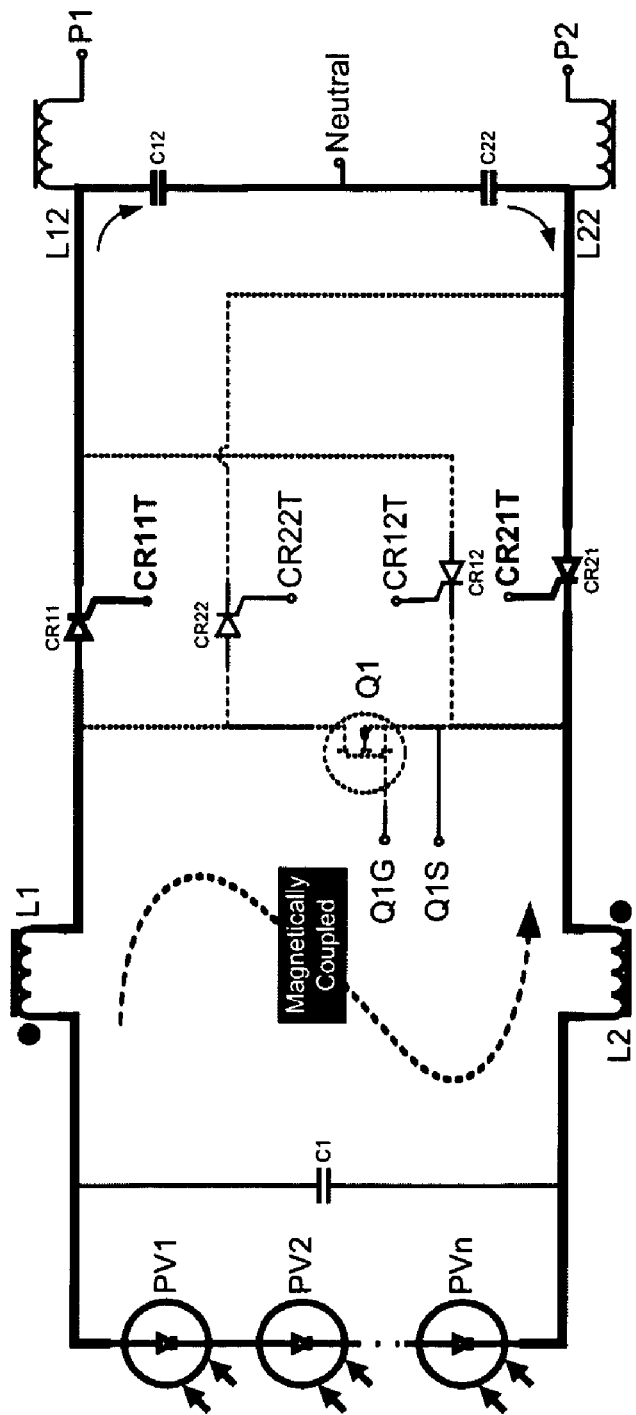
FIG. 6 shows a pulse amplitude modulated current converter with current flowing through into the reconstruction filters for the grid positive half phase.
Figure 7:
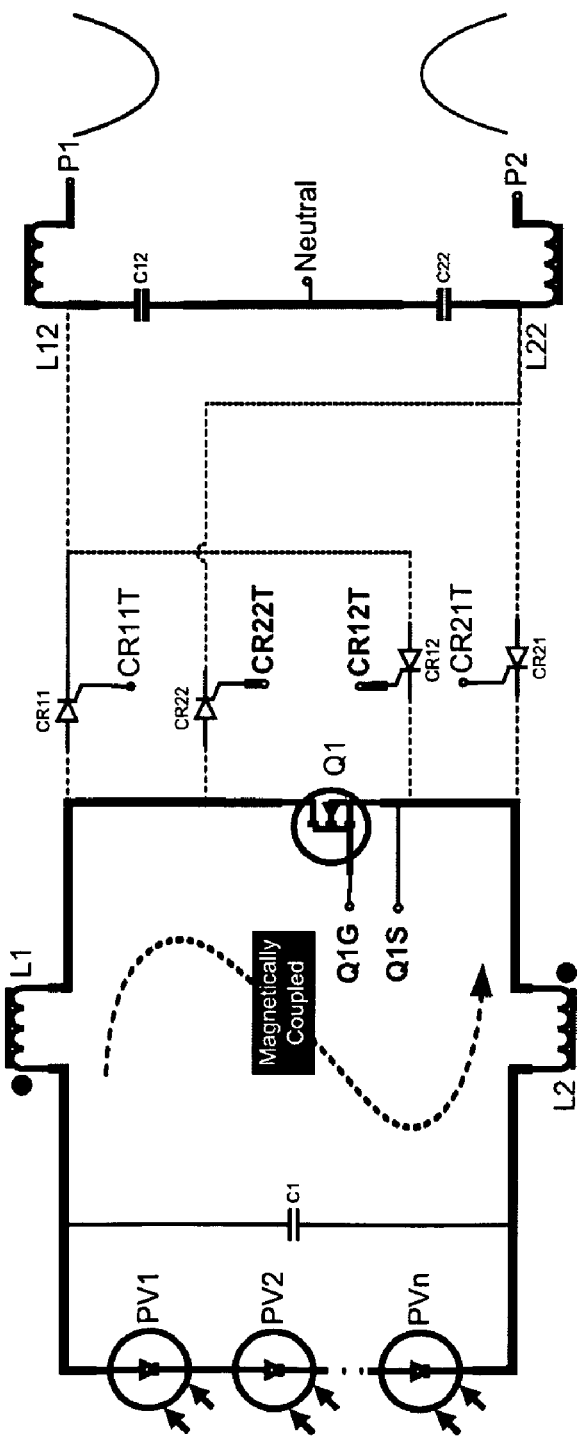
FIG. 7 shows a pulse amplitude modulated current converter with a transistor completing the circuit to charge inductors while reconstruction filters produce current pulses for the grid negative half phase.
Figure 8:
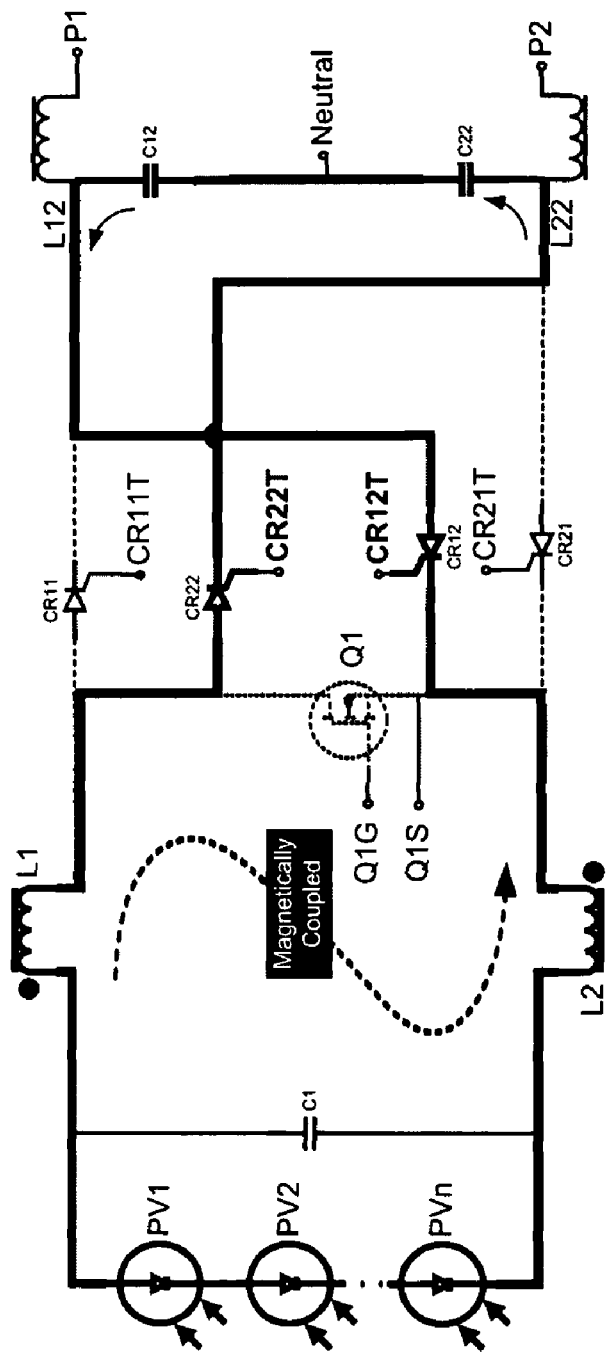
FIG. 8 shows a pulse amplitude modulated current converter with current flowing through into the reconstruction filters for the grid negative half phase.

Referring to FIG. 6, with L1 406 and L2 405 charged Q1, 404 is turned off for a pulse width modulated time. After the off time has expired, Q1 404 is turned on until the end of the instant current switching cycle. During the time that Q1 404 is off, current previously stored in L1 406 and L2 405 together with the current flowing in PV 401 is applied to the input terminals of CR12 425 and CR22 423 which remain enabled by signals CR22T 420 and CR12T 421 for the entire negative half cycle of the grid. The negative half cycle of the grid is defined as the condition wherein the voltage at terminal P1 434 is less than the voltage at terminal P2 436. The charge in the current pulse delivered through the SCR CR22 423 is initially stored on capacitor C22 440, creating a voltage more positive on the near end of coil L22 431 relative to the end connected to terminal P2 436. The charge in the current pulse delivered through CR12 425 is initially stored on C12, a voltage more positive on the near end of coil L12 430 relative to the end connected to terminal P1 434. This is the initial condition for both reconstruction filter comprising L12 430, C12 438 and reconstruction filter comprising L22 431, C22 440. At this point the reconstruction filters will transform the pulse width modulated current pulse delivered to them to a pulse amplitude modulated half sine wave of current delivered to the grid as shown in FIG. 4.

The reconstruction filters for Case 2 are the same components as described in association with Case 1; their design and operation are not repeated here.

The off time of Q1 404 is modulated such that the width of current pulses produced is in the shape of the grid sine wave. The reconstruction filters transform this sequence of pulse width modulated current pulses into a sequence of pulse amplitude modulated current pulses whose amplitude follow corresponding points of the shape of the grid sine wave.

So long as the grid half cycle remains negative, with the voltage of terminal P1 434 more negative than the voltage of terminal P2 436, further current pulses are produced by repeating the process described hereinbefore, beginning at "CASE 2: PWM modulation for negative half wave of grid."

The positive zero crossing of the grid voltage is defined as the condition wherein the voltage at terminal P1 434 is equal to P2 436 after the voltage at terminal P1 434 has been more negative than the voltage of terminal P2 436. Prior to the positive zero crossing, Q1 404 is turned on, removing current from SCRs CR12 425 and CR22 423. At this point the signals CR12T 421 and CR22T 420 are de-asserted, preventing SCRs CR12 425 and CR22 423 from conducting current during the grid positive half cycle. After the positive zero crossing with P1 434 more positive than P2 436, signals CR11T 419 and CR21T 421 are asserted, enabling SCRs CR11 424 and CR21 426 to conduct when current is applied to them.

With the grid again positive, the process would again return to the process described hereinbefore, beginning with the section labeled CASE 1: PWM modulation for positive half wave of the grid.

Figure 9:
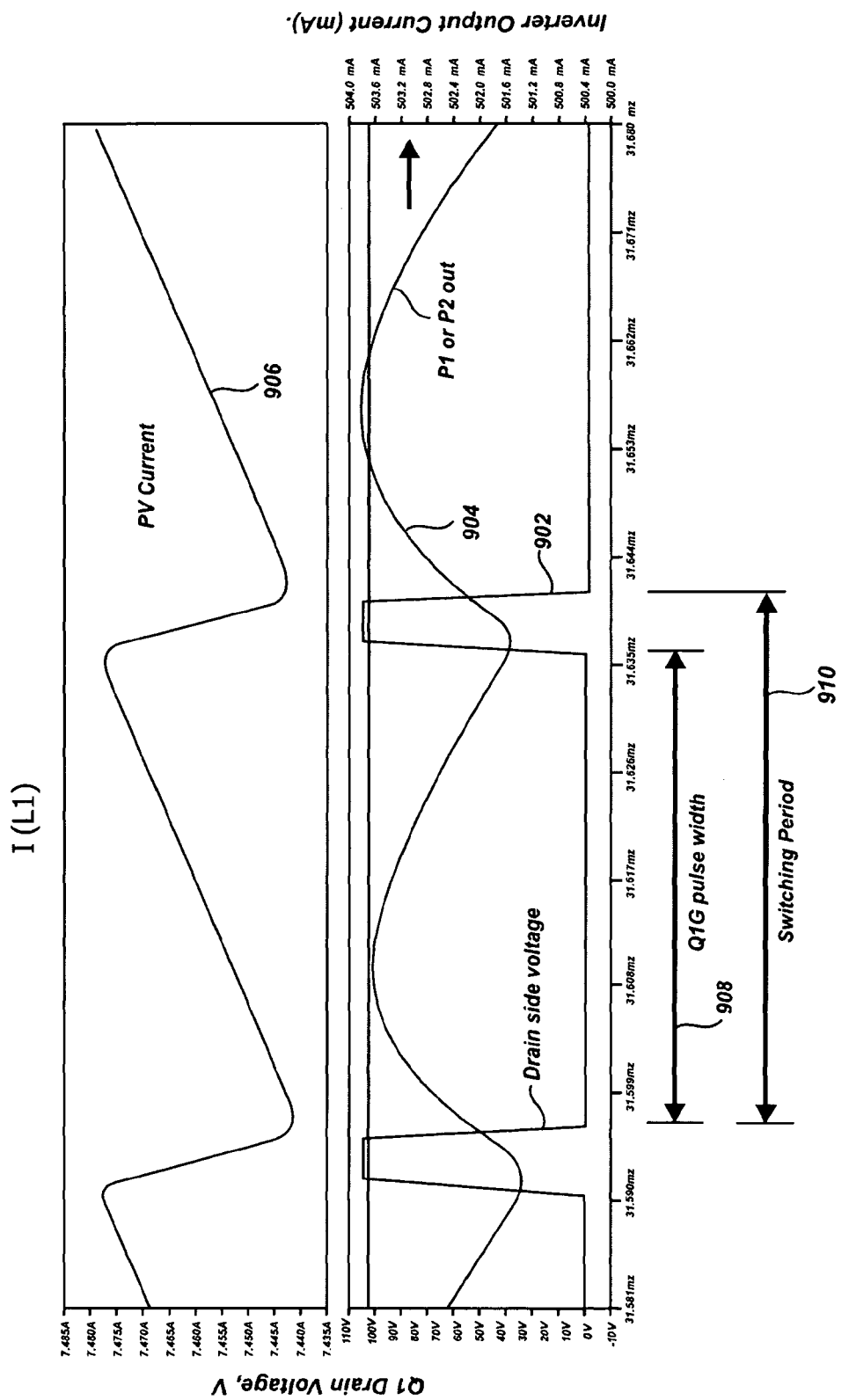
FIG. 9 relates the timing of drive signals and current.

FIG. 9 shows a signal diagram of the results of the conversion of a pulse width modulated pulse, translated into a pulse amplitude modulated (PAM) current pulse by a reconstruction filter, such as those previously disclosed hereinbefore (L12 430 and C12 438; L22 431 and C22 440). The short duration roughly rectangular voltage pulses 902 are the voltage on the drain side 451 (FIG. 4) of Q1 404. The pulse width labeled 908 approximates the pulse width of the signal Q1G on line 411 (FIG. 4) and the period 910 is the switching period of the PAMCC 400. This voltage drives the transformer 407 and PV 401 currents through a SCR CR11 424 or CR12 425 (depending upon the instant status of the control signals from controller 412, as previously described) into the input of one of the reconstruction filters. The rounded half wave rectified sine wave 904 is the output of the reconstruction filter. As the pulse width 908 (approximately) of the input pulse increases, the amplitude of the output wave form 904 increases. The triangular wave form 906 at the top of the graphs plots the variation of current through PV 401 during the common window of time. Trace 906 shows the effect of transformer 407 in maintaining a relatively constant PV 401 current, independent of the relatively large pulse width modulated current pulses provided to the reconstruction filters.

Figure 10:
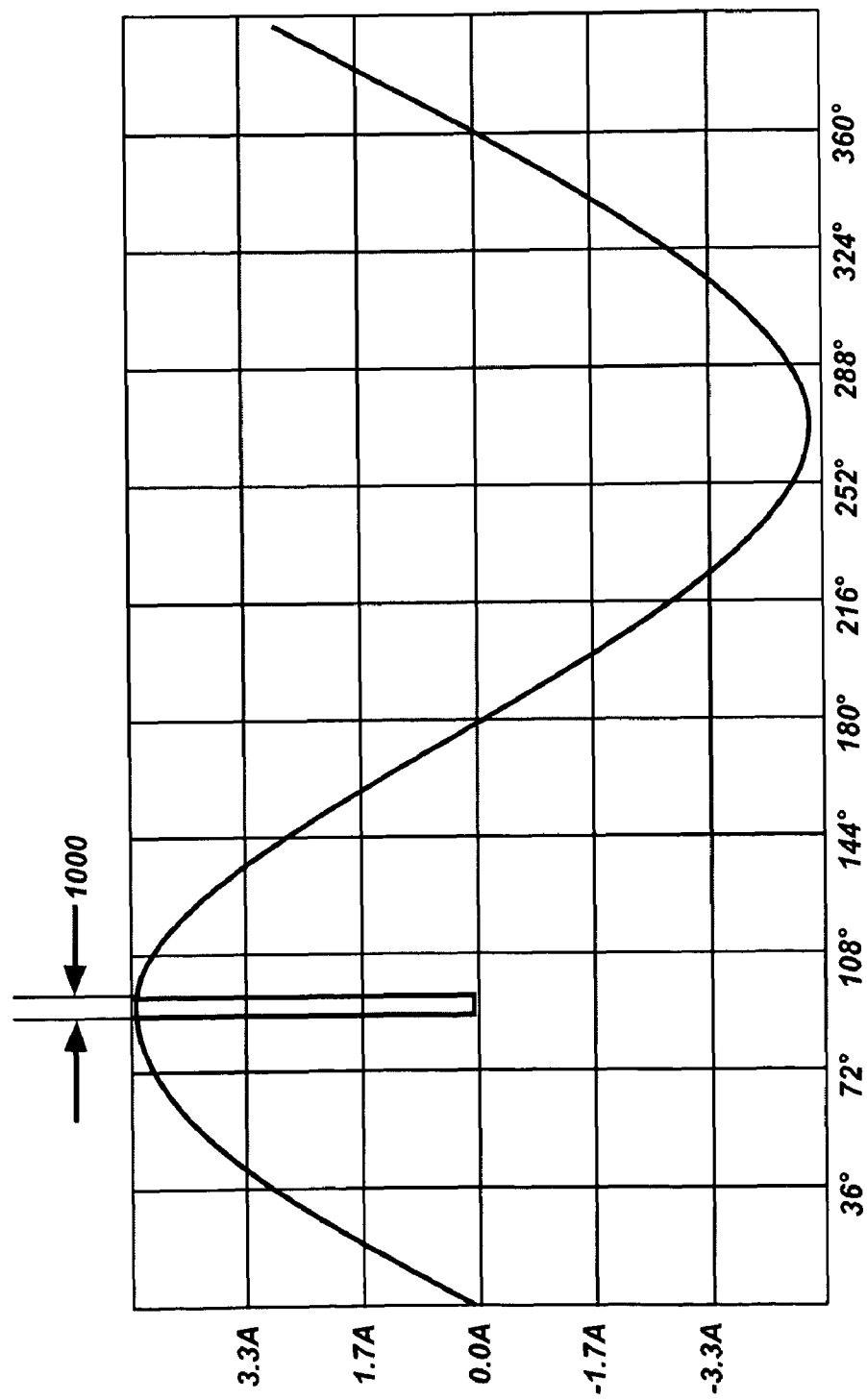
FIG. 10 shows what portion of current in a sine wave of current will be examined in detail in some following drawings.
Figure 11:
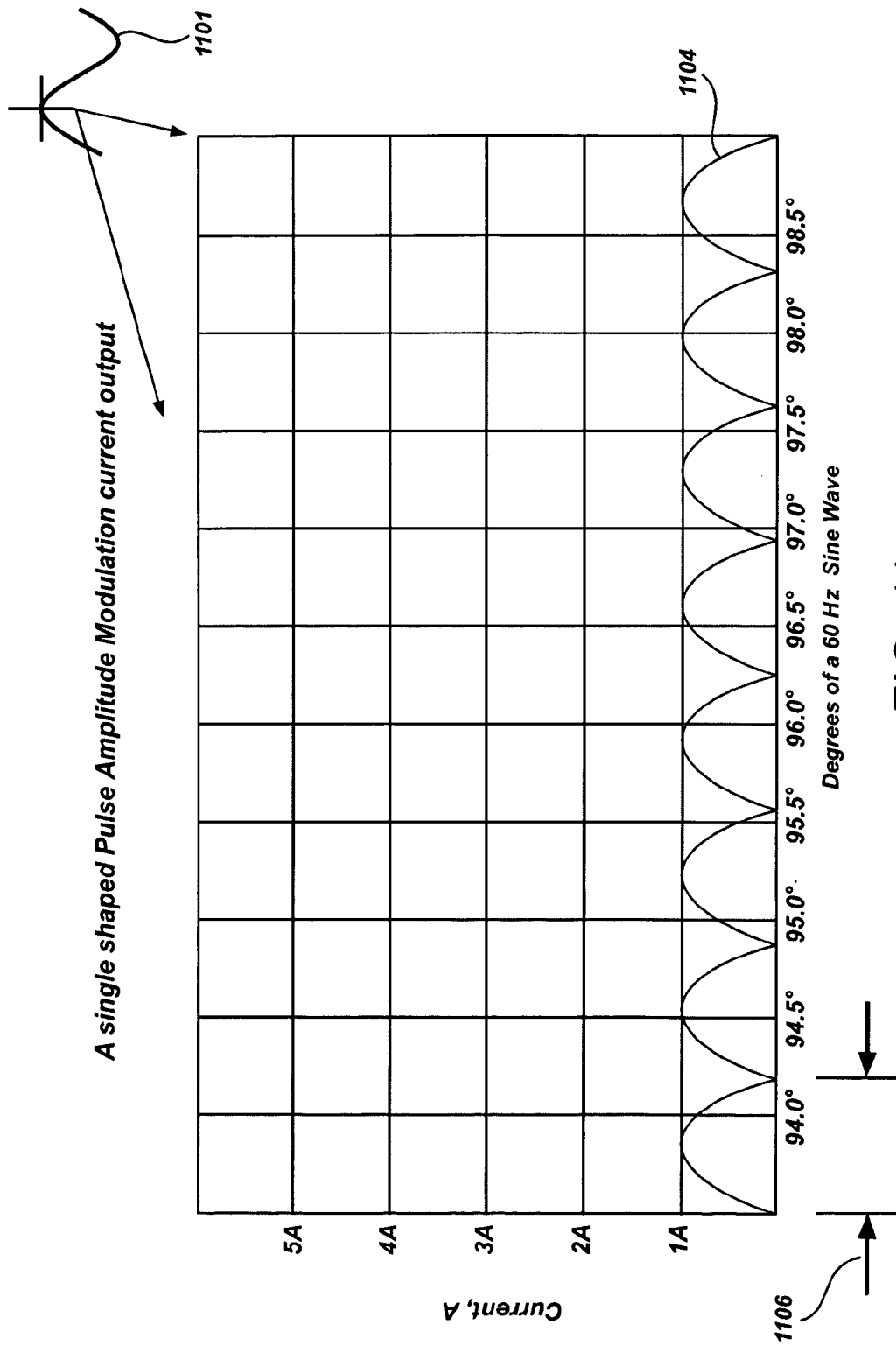
FIG. 11 shows the pulses provided by a single pulse amplitude modulated current converter.
Figure 12:
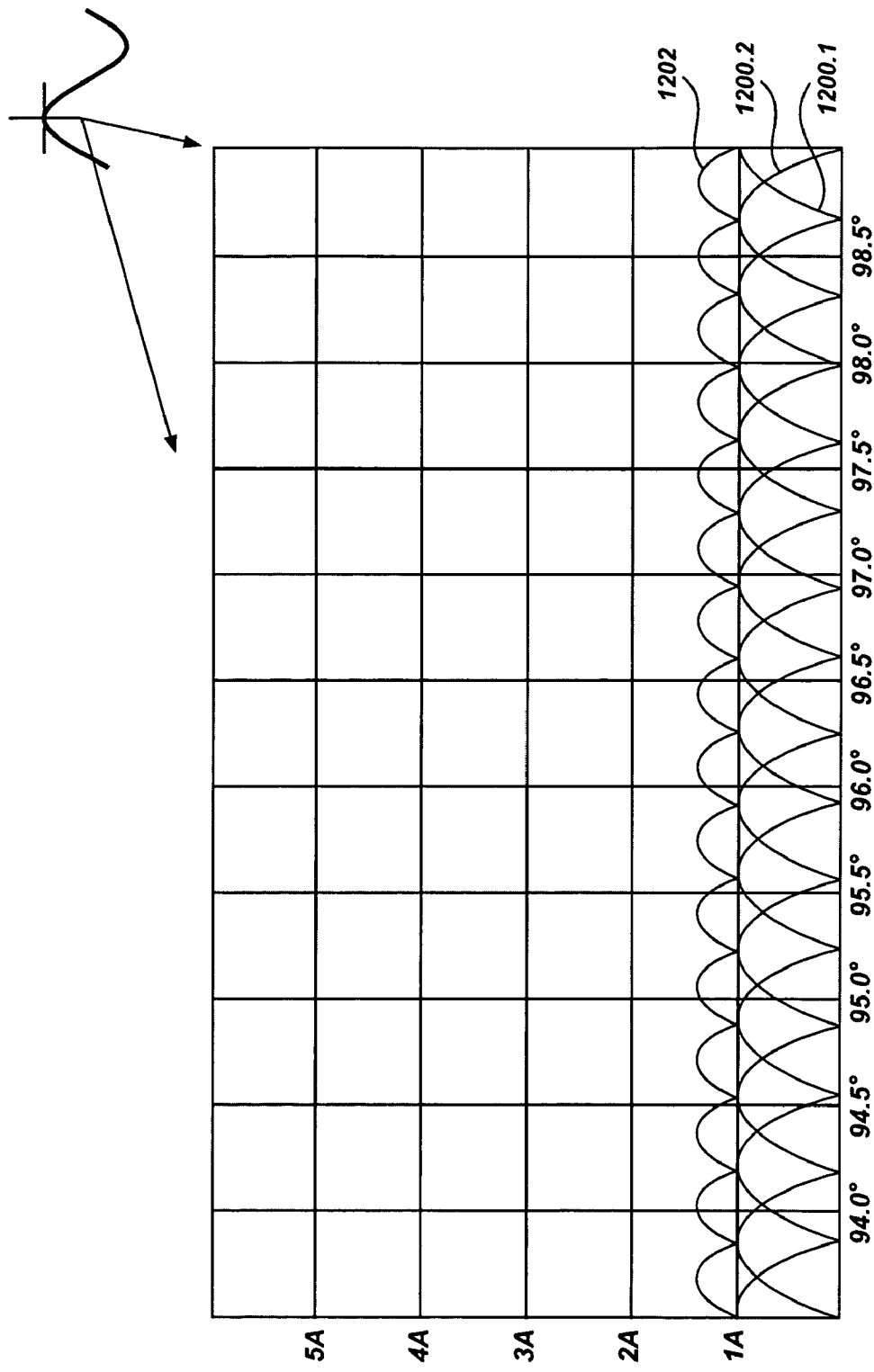
FIG. 12 shows the pulses provided by two pulse amplitude modulated current converters and their total, summed current.
Figure 13:
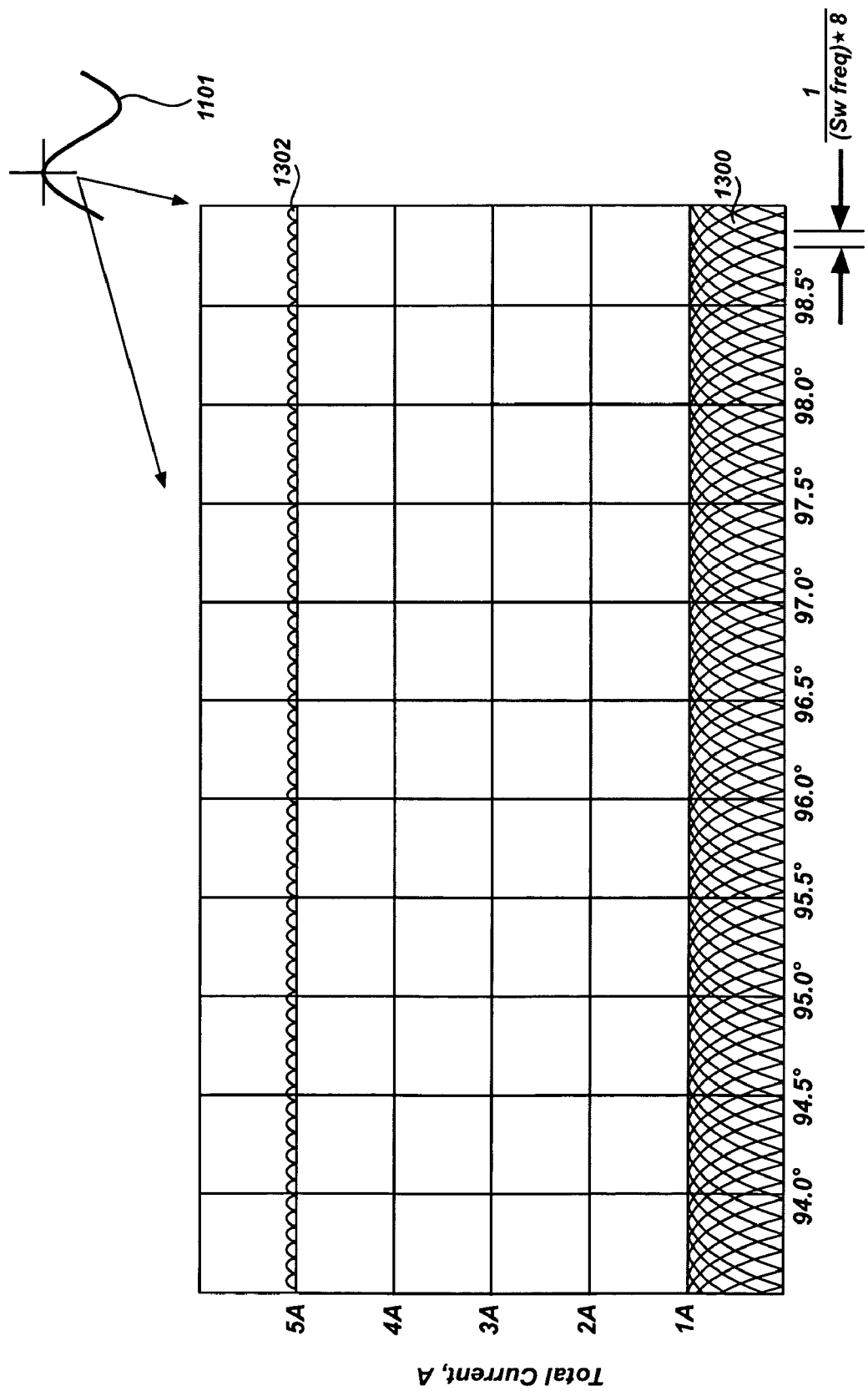
FIG. 13 shows the pulses provided by eight pulse amplitude modulated current converters and their total, summed current.

FIG. 10 indicates the narrow time slice of a grid sine wave cycle to be depicted in FIG. 11, 12 and 13.

FIG. 11 shows the pulse amplitude modulated output current of a single PAMCC 400. Note that the amplitude shown is for a small portion of time near the positive peak of the grid voltage as indicated on the cycle example 1101. The individual pulses 1104 have a period 1106 equal to the period of the switching frequency, for example (1/30 KHz).

In FIG. 12, two individual currents (1200.1 and 1200.2) of two PAMCCs (each in accordance with the PAMCC 400) are phased apart one half of the period of the switching frequency. The trace 1202 above is the sum of the two PAMCC output currents 1200.1 and 1200.2. Note that the summed current 1202 has a much smaller ripple than the ripple of a single PAMCC (see FIG. 11) and has twice the ripple frequency as of the ripple frequency of a single inverter. The summed current 1202 does not return to zero.

Following on the summation of the currents of two PAMCC 400 outputs, FIG. 13 shows the individual output currents of eight PAMCCs (the line 1300 is representative; each waveform is not numbered), each phased evenly across the period of the switching frequency. For example for a system using a 30 KHz switching frequency, the period is 33.3 microseconds and each phase is delayed by (33.3/8), or 4.167 microseconds, relative to the previous output current waveform. Any number of PAMCCs 400 may be so summed. As the number summed increases they are each phase delayed by a smaller number (1/(switching frequency)*n) where "n" is the number of PAMCCs summed. Note that the summed current shown in FIG. 13 has only a fraction of the ripple current of an individual PAMCC (FIG. 12) and has eight times the ripple frequency of that of an individual PAMCC. If each PAMCC 400 is producing a point on a grid sine wave with its sequence of PAM current pulses, phasing and summing a set of PAMCCs, forming an array of converters, will effectively demodulate a grid sine wave of current with very high accuracy and very low noise (ripple). Any number of array converters may be phased and summed in this way. As the number of PAMCCs is increased, the ripple amplitude decreases and the ripple frequency increases. In one embodiment two or more of the plurality of PAMCC 400 individual output currents are in phase with each other. In some embodiments the switching frequency is selected so as to be unrelated to the grid frequency, for example 60 Hz in the United States, the ripple will not represent harmonic distortion. Signals modulated onto the PAMCC output are arbitrary. In some embodiments multiple signals are modulated onto the PAMCC output, wherein one of such signals may, for example, provide for communication between an arbitrary two or more PAMCC modules. The PAMCC modulation is sometimes used to correct for distortion in the grid signal.

One of several ways to choose the phasing of the arrayed PAMCCs 400 is for each PAMCC 400 to be pre-assigned a timing slot number, with the first slot being scheduled following a zero crossing and each PAMCC 400 firing its PAM signal in the predetermined (i.e., assigned) sequence.

Figure 14:
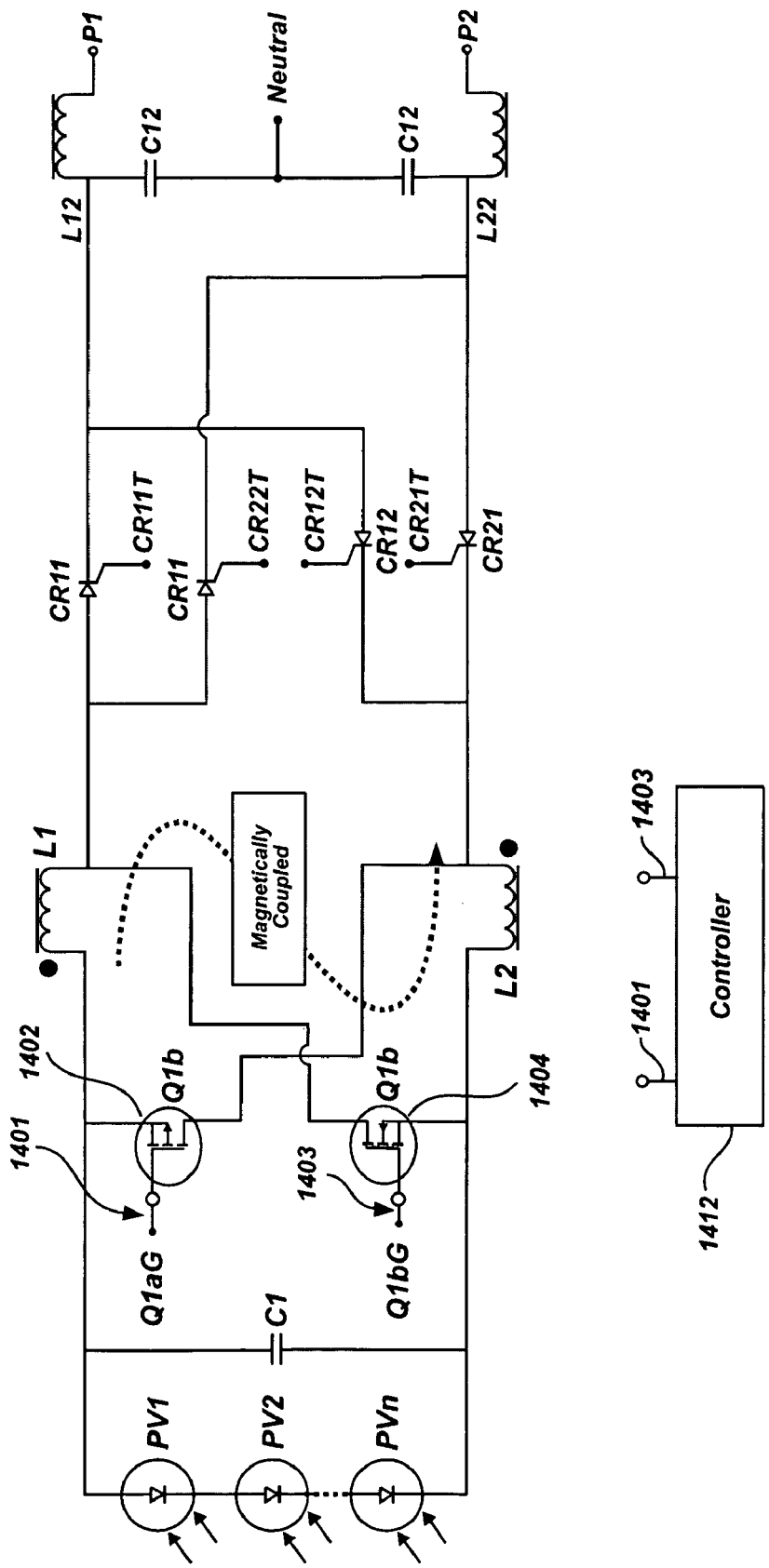
FIG. 14 shows an alternative circuit for a single pulse amplitude modulated current converter.

In an alternative embodiment, exemplified in FIG. 14, a second transistor is added, wherein Q1A 1402 and Q1B 1404 replace the single transistor Q1 404 as was shown and described in the circuit of FIG. 4. Using the two transistors Q1A 1402 and Q1B 1404 provides some potential advantages, including reducing the voltage across each transistor, allowing a more relaxed Rds_on (the "on" resistance) requirement for each transistor compared to the Rds_on requirement of Q1 404, and allowing each transistor to be driven with respect to the relatively low voltage and stable anode and cathode ends of PV 401. In this configuration, Q1A 1402 and Q1B 1404 are both turned on and off at the same times as with Q1 404 in the previous discussion. All other aspects of the circuit operation remain the same. Q1A 1402 and Q1B 1404 are of different transistor types, so separate signals to their control gates are provided by the control 1412. Controller 1412 is otherwise the same as controller 412 of FIG. 12, with the addition of output terminals connected to the control gates of Q1A 1402 and Q1B 1404 via lines 1401 and 1403 respectively.

Figure 15:
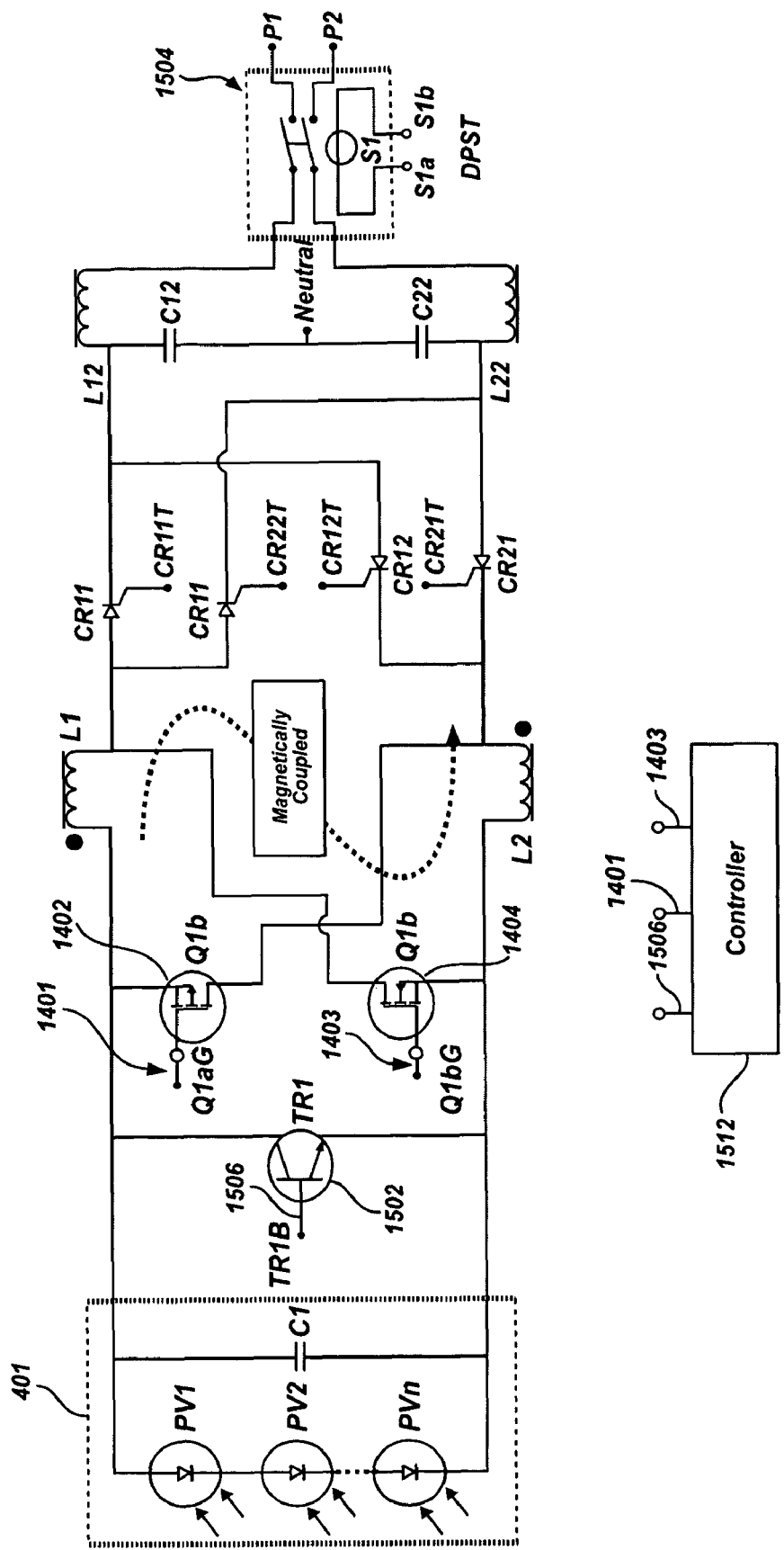
FIG. 15 shows a circuit for a single pulse amplitude modulated current converter wherein the converter can be disabled.

In some embodiments the system may be shut down for safety, maintenance, or other purposes. One example of a shut-down method is shown in FIG. 15. A transistor TR1 1502 and a relay S1 1504 are added as shown. Note that this example includes the two transistors Q1A 1402 and Q1B 1404, however the same shut-down provision can be added to the circuit of FIG. 4, wherein the two transistors Q1A and Q1B are replaced by the single transistor Q1 404. Transistor TR1 1502 and relay S1 1504 provide for the safe shutdown of PAMCC while connected to PV 401, which is illuminated and producing power. The shutdown process is initiated by providing a signal TR1B from controller 1512 on a line 1506, the line 1506 connected to the control gate of the transistor 1502. When transistor TR1 1502 turns on, TR1 creates a short path for current produced by PV 401, which results in the voltage across PV 401 to be reduced to a small level. At this point, Q1A 1402 and Q1C 1404 are energized to allow the currents in the coils L1 406 and L2 405 to fall to a low level. After the coils L1 and L2 are discharged, relay S1 1504 is opened. With the path to the grid now open, Q1A 1402 and Q1B 1404 are turned off, followed by turning off transistor TR1 1502. In this configuration, no further power will be produced.

Figure 16:
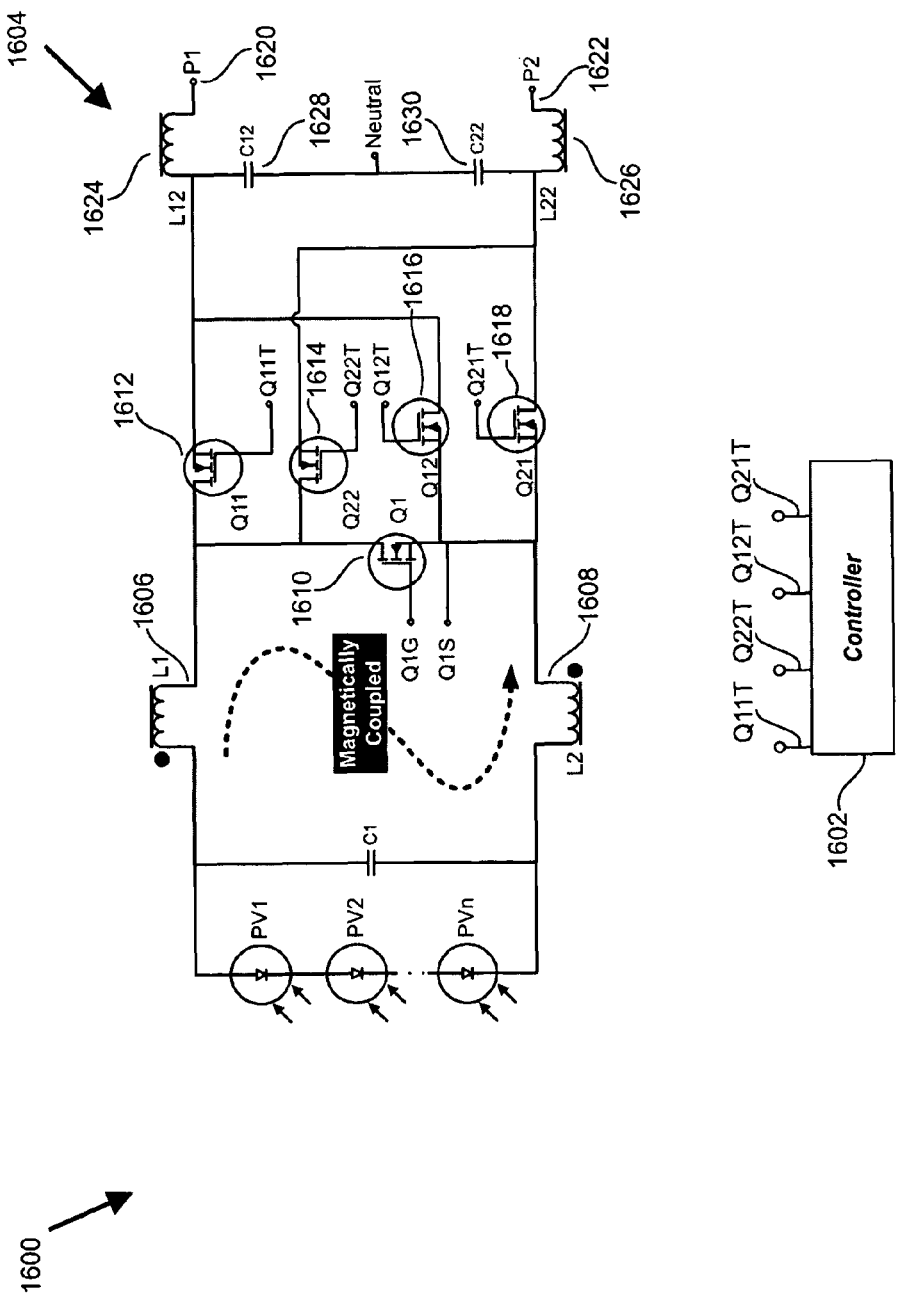
FIG. 16 is an example of a single DC source providing current to a plurality of pulse amplitude modulated current converters to form a power supply to a common load.

Looking to FIG. 16, an array converter module 1600 comprises a controller 1602 and an array converter control unit 1604. The controller 1604 includes means for executing logical instructions, for example a microprocessor, digital signal processor, or custom logic. Controller 1604 controls the FET switches of the array converter unit 1604 by providing control signals to the control gates of the FET switches 1612, 1614, 1616, and 1618. To avoid obscuring the invention the connecting lines and level translators are not shown. Also, for clarity, the reference numbers of FIG. 16 are not repeated on FIGS. 17, 18, 19, and 20.

The circuit of FIG. 16 can be seen to be similar to FIG. 4, wherein the SCRs of FIG. 4 (424, 423, 422, 421) have been replaced with FET switches (1612, 1614, 1616, 1618). The circuit of FIG. 16 can provide the same control of power conversion from the PV to the output terminals as the circuit of FIG. 4, adding the capability of current to flow through the FET switches in any direction.

Figure 17:
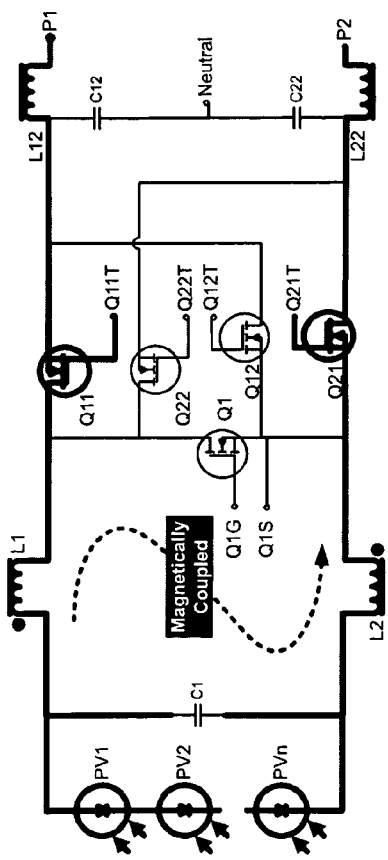
FIG. 17 is the circuit of FIG. 16, configured as a buck power converter during a half-cycle of an input alternating current power source.
Figure 18:
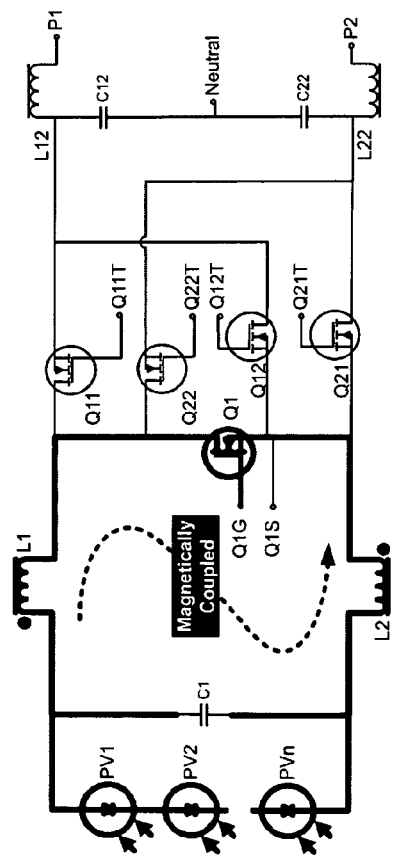
FIG. 18 is the circuit of FIG. 16, configured as a buck power converter during a synchronous phase following the configuration of FIG. 17.

In FIGS. 17, 18, 19, and 20 we indicate FETs that have been turned on and paths that are carrying current with heavier dark lines than the rest of the schematic. In FIG. 17, the array converter control unit 1604 is reconfigured by the controller 1602 to connect the load, for example an electrical grid, from the output terminals 1620, 1622 to the coils L1 and L2 (1606, 1608 respectively). Assume for the moment that the grid provided to the output terminals 1620, 1622 is in a positive phase. We see then that a buck converter has been formed by turning on FET switches 1612 and 1618 at the same time, thereby connecting the positive voltage to coil L1 1606, with the terminal 1622 and coil L2 1608 comprising the "low side" of the buck converter, across the series capacitors C12 1628 and C22 1630. Note that coils L1 1606 and L2 1608 are a much higher inductance value than the reconstruction coils L12 1624 and L22 1626. For buck converters this phase is denominated a "power pulse." In FIG. 18 the FET switches 1612 and 1618 have been turned off (opened) and the FET switch 1610 turned on (closed) to provide the synchronous pulse of a buck converter. The basic operation of a buck converter is well known to those skilled in the art.

Now we assume that the electrical grid input at the output terminals 1620, 1622 is in its negative phase. The controller 1602 turns on (closes) FET switches 1614 and 1616, again providing positive voltage to coil L1 1606. As with FIG. 18, in FIG. 19 the FET switches 1614, 1616 are turned off (open) and the FET 1610 turned on (closed) to again provide the sync pulse. Thus we see that by controlling the four FET switches 1612, 1614, 1616, 1618 we have formed a full-wave rectifier and a buck converter. In one embodiment the steps shown in FIG. 19, 20 are skipped, forming a nonsynchronous buck converter.

The above steps disclose providing forward bias current to the cells of the PV. Obviously by performing the steps of FIG. 17, 18 during a negative phase of the electrical grid, and the steps of FIG. 19, 20 during a positive phase of the electrical grid, a reverse bias current is provided to the PV.

Whether to provide forward or reverse bias current to the solar cells is a decision to be made by the manufacturer; the present invention provides the means and flexibility to drive current in either direction, and at a voltage determined by the duty cycle of the buck converter, a technique well known to one skilled in the art.

In some embodiments a given array converter is installed cooperatively with many other array converters to provide power to an electrical grid or other load. In some embodiments the power provided to the output terminals 1620, 1622 of a given array converter control unit 1604 comes from some or all of the other array converters in the macro system. Controllers 1602 may be equipped with memory and algorithms to enable each controller to determine when (or if) the PV to which it is connected should be reconditioned, based upon time, measured parameters, or commands from an external host.

Figure 3:
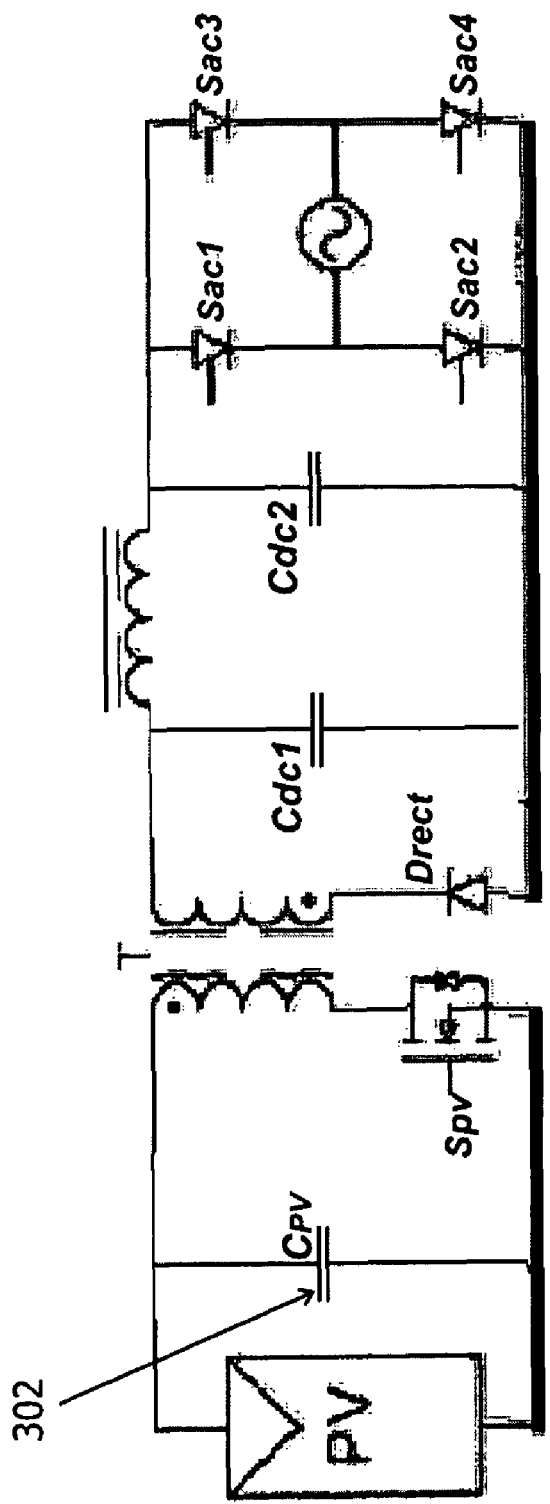
FIG. 3 is an example of the current art. PRIOR ART.
Figure 21:
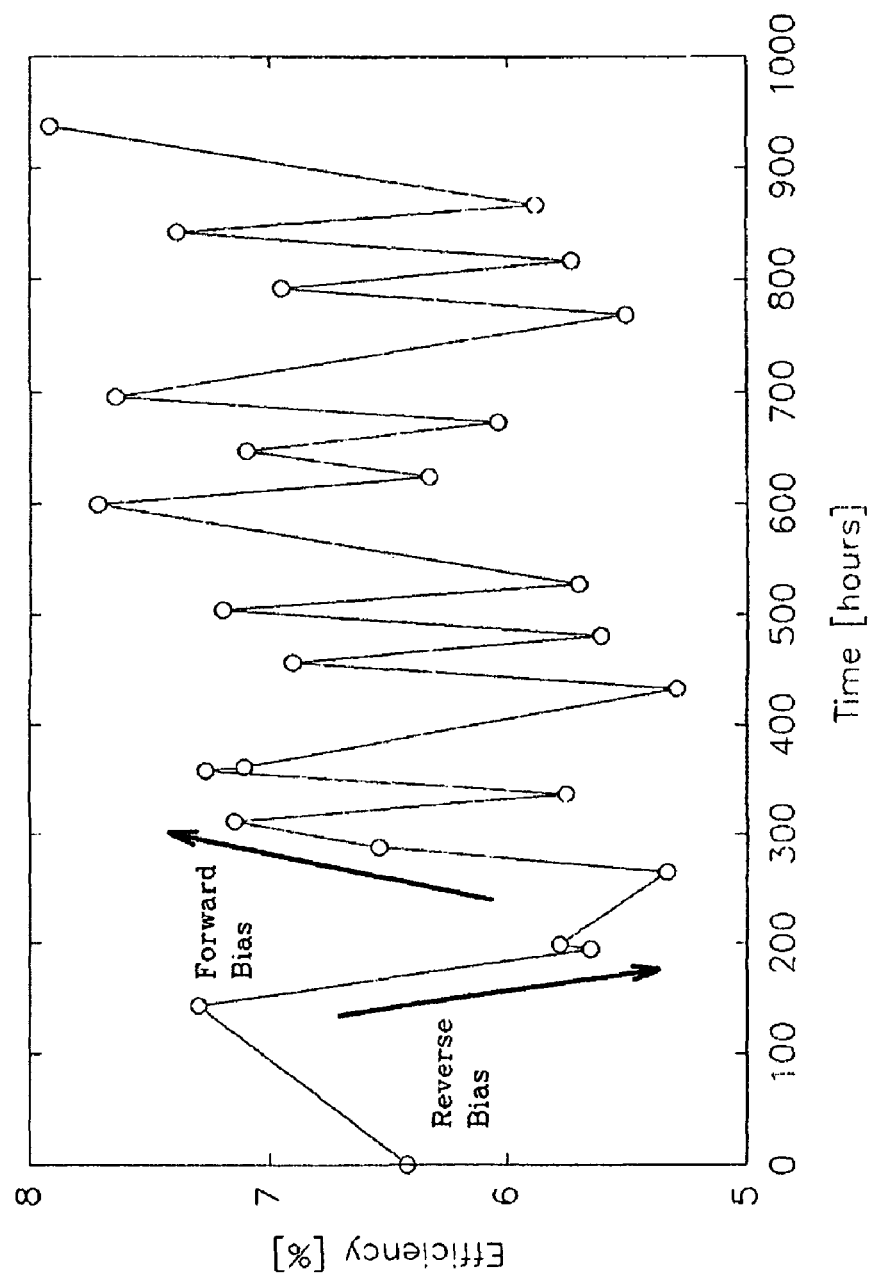
FIG. 21 is a graph illustrating an improvement of efficiency of a suboptimum Cd—Te solar panel resulting from the application of forward bias through the solar panel.

The resulting improvement from reconditioning can be seen in FIG. 21, corresponding to FIG. 3.9 on page 19 of a 1995 report "Fabrication of Stable, Large-Area Thin-Film CdTe Photovoltaic Modules; Final Subcontract Report 10 May 1991-28 Feb. 1995" by T. X. Zhou, published by th National Renewable Energy Laboratory, 1617 Cole Boulevard, Golden, Colo. FIG. 21 shows efficiency increasing with the application of a forward bias current, decreasing during a reverse bias current period. Reverse bias current corresponds to the operational configuration wherein a PV and array converter are providing power at the output terminals 1620, 1622. Further research by solar cell manufacturers may lead to other optimizing, reconditioning schemes of bias polarity and magnitude, which the present invention can provide with proper programming of the buck converter algorithm.

What is claimed is:

1. A system for reconditioning solar cells, the system comprising:
   an array converter comprising:
      a first coil, including an input terminal and an output terminal, wherein the input terminal is connected to a positive terminal of a photovoltaic panel;
      a second coil, including an input terminal and an output terminal, wherein the input terminal of the second coil is connected to a negative terminal of the photovoltaic panel;
      a first switch connecting the output terminals of the first coil and the second coil;
      a first reconstruction filter coil having an input terminal and an output terminal, the output terminal connected to the power source;
      a second switch connected between the output terminal of the first coil and the input terminal of the first reconstruction filter coil;
      a second reconstruction filter coil having an input terminal and an output terminal, the output terminal connected to the power source;
      a third switch connected between the output terminal of the second coil and the input terminal of the second reconstruction filter coil, wherein the power source is connected across the output terminal of the first reconstruction coil and the output terminal of the second reconstruction coil;
      a fourth switch connected between the output terminal of the first coil and the input terminal of the second reconstruction filter coil;
      a fifth switch connected between the output terminal of the second coil and the input terminal of the first reconstruction filter coil; and
      a controller operatively connected to control gates of each of the first switch, the second switch, the third switch, the fourth switch, and the fifth switch.

2. The system for reconditioning solar cells of claim 1, wherein the external power source provides alternating current to the array converter, and the controller is configured to send signals to the control gates of the first switch, the second switch, the third switch, the fourth switch, and the fifth switch in such a manner that the array converter operates as an inverter and a buck converter to apply a bias current to the photovoltaic panel.

3. The system for reconditioning solar cells of claim 2, wherein the power source is alternating current provided by an electrical grid.

4. The system for reconditioning solar cells of claim 2, wherein the controller is configured to send signals to the control gates of the first switch, the second switch, the third switch, the fourth switch, and the fifth switch in such a manner that the bias current applied to the photovoltaic panel is forward biased with respect to the photovoltaic panel.

5. A method for providing bias current to a photovoltaic panel for reconditioning solar cells in the photovoltaic panel, the method comprising:
   connecting an array converter system to a power source for receiving power and to the photovoltaic panel, wherein the array converter is configured to provide a version of the power received from the power source to the photovoltaic panel;
   configuring the array converter system as a rectifier and connecting an output of the rectifier to a buck type power converter;
   controlling the buck type power converter to provide direct current to the photovoltaic panel as a bias current configured to recondition the solar cells in the photovoltaic panel.

6. The method according to claim 5, wherein the power source is alternating current provided by an electrical grid.

7. The method according to claim 5, wherein the power source is provided by other array converter systems operatively connected to the array converter.

8. The method according to claim 5, wherein the power source is direct current.

9. The method according to claim 5, wherein the bias current is forward biased with respect to the photovoltaic panel.

10. The method according to claim 5, wherein the bias current is reverse biased with respect to the photovoltaic panel.

11. The method according to claim 5, wherein the solar cells in the photovoltaic panel are cadmium-telluride (Cd—Te) solar cells.

12. The method of claim 5, further comprising configuring the array converter system to receive direct current from the photovoltaic panel and output alternating current when not providing a bias current to the photovoltaic panel.

13. The method according to claim 5, wherein the array converter system comprises:
  a first coil, including an input terminal and an output terminal, wherein the input terminal is connected to a positive terminal of the photovoltaic panel;
  a second coil, including an input terminal and an output terminal, wherein the input terminal of the second coil is connected to a negative terminal of the photovoltaic panel;
  a first switch connecting the output terminals of the first coil and the second coil;
  a first reconstruction filter coil having an input terminal and an output terminal, the output terminal connected to the power source;
  a second reconstruction filter coil having an input terminal and an output terminal, the output termal connected to the power source;
  a third switch connected between the output terminal of the second coil and the input terminal of the second reconstruction filter coil, wherein the power source is connected across the output terminal of the first reconstruction coil and the output terminal of the second reconstruction coil;
  a fourth switch connected between the output terminal of the first coil and the input terminal of the second reconstruction filter coil;
  a fifth switch between the output terminal of the second coil and the input terminal of the first reconstruction filter coil; and
  a controller operatively connected to control gates of each of the first switch, the second switch, the third switch, the fourth switch, and the fifth switch.

14. The method of claim 13, wherein configuring the array converter system as a rectifier and connecting an output of the rectifier to a buck type power converter comprises configuring the controller to send signals to the control gates of the first switch, the second switch, the third switch, the fourth switch, and the fifth switch in such a manner that the array converter system operates as an inverter and a buck converter.

15. The method of claim 13, wherein the controller comprises memory and is configured with algorithms, the method further comprising determining when the photovoltaic panel should be reconditioned based upon one or more of time, measured parameters, and commands from an external source.

16. A power generation system, comprising:
  a photovoltaic panel; and
  an array converter electrically coupled to the photovoltaic panel and to an external power source, the array converter comprising:
    a first coil, including an input terminal and an output terminal, wherein the input terminal is connected to a positive terminal of the photovoltaic panel;
    a second coil, including an input terminal and an output terminal, wherein the input terminal of the second coil is connected to a negative terminal of the photovoltaic panel;
    a first switch connecting the output terminals of the first coil and the second coil;
    a first reconstruction filter coil having an input terminal and an output terminal, the output terminal connected to the power source;
    a second reconstruction filter coil having an input terminal and an output terminal, the output termal connected to the power source;
    a third switch connected between the output terminal of the second coil and the input terminal of the second reconstruction filter coil, wherein the power source is connected across the output terminal of the first reconstruction coil and the output terminal of the second reconstruction coil;
    a fourth switch connected between the output terminal of the first coil and the input terminal of the second reconstruction filter coil;
    a fifth switch between the output terminal of the second coil and the input terminal of the first reconstruction filter coil; and
    a controller operatively connected to control gates of each of the first switch, the second switch, the third switch, the fourth switch, and the fifth switch,
  wherein the controller is configured to send signals to the control gates of the first switch, the second switch, the third switch, the fourth switch, and the fifth switch in such a manner that the array converter operates as an inverter and a buck converter to apply a bias current to the photovoltaic panel.

17. The power generation system of claim 16, wherein the photovoltaic panel comprises a plurality of cadmium-telluride (Cd—Te) solar cells.

18. The power generation system of claim 16, wherein the controller comprises:
  memory; and
  a processor coupled to the memory, wherein the processor is configured with algorithms to perform operations comprising determining when the photovoltaic panel should be reconditioned based upon one or more of time, measured parameters, and commands from an external source.

19. The power generation system of claim 16, wherein the controller is configured to send signals to the control gates of the first switch, the second switch, the third switch, the fourth switch, and the fifth switch in such a manner that the array converter receives direct current from the photovoltaic panel and outputs alternating current when the array converter is not providing a bias current to the photovoltaic panel.

20. The power generation system of claim 16, wherein the controller is configured to send signals to the control gates of the first switch, the second switch, the third switch, the fourth switch, and the fifth switch in such a manner that the array converter receives direct current from the photovoltaic panel and outputs direct current when the array converter is not providing a bias current to the photovoltaic panel.

* * * * *